United States Patent [19]
Chung et al.

[11] Patent Number: 5,699,266
[45] Date of Patent: Dec. 16, 1997

[54] METHOD AND APPARATUS FOR AUTOMATICALLY RECOGNIZING REPEATED SHAPES FOR DATA COMPACTION

[75] Inventors: Virginia M. Chung, Pleasant Valley; James E. Stuart, Hopewell Junction, both of N.Y.

[73] Assignee: International Business Machines Corporation, Armonk, N.Y.

[21] Appl. No.: 650,881

[22] Filed: May 1, 1995

Related U.S. Application Data

[62] Division of Ser. No. 62,629, May 18, 1993, Pat. No. 5,481,472.

[51] Int. Cl.⁶ .................................................. G06F 15/00
[52] U.S. Cl. ................................. 364/491; 250/492.22
[58] Field of Search .............................. 250/492.1, 492.2, 250/492.22; 364/488–491, 468.28; 430/5, 296; 382/10

[56] References Cited

U.S. PATENT DOCUMENTS

| | | | |
|---|---|---|---|
| 4,291,231 | 9/1981 | Kawashima | 250/492 |
| 5,251,140 | 10/1993 | Chung et al. | 364/474.02 |
| 5,294,800 | 3/1994 | Chung et al. | 250/492.22 |
| 5,428,552 | 6/1995 | Rudert, Jr. et al. | 364/491 |
| 5,432,714 | 7/1995 | Chung et al. | 364/525 |
| 5,481,472 | 1/1996 | Chung et al. | 364/491 |

*Primary Examiner*—Paul V. Kulik
*Attorney, Agent, or Firm*—Whitham, Curtis, Whitham & McGinn; H. Daniel Schnurmann

[57] ABSTRACT

A methodology and apparatus for extracting repeated data from a large body of data for compaction and reproduction by step-and-repeat operations includes extraction of data based on common parameters and a variable parameter. Lists are formed from the extracted data after ordering and repeat displacements are computed. Maximum displacement or delta is also computed and compared based on the range of addresses in the lists and a minimum number of step-and-repeat operations which can be done with a command which represents a compaction of data. A plurality of compressed data coding formats are provided and optimally applied during operation of the invention.

6 Claims, 11 Drawing Sheets

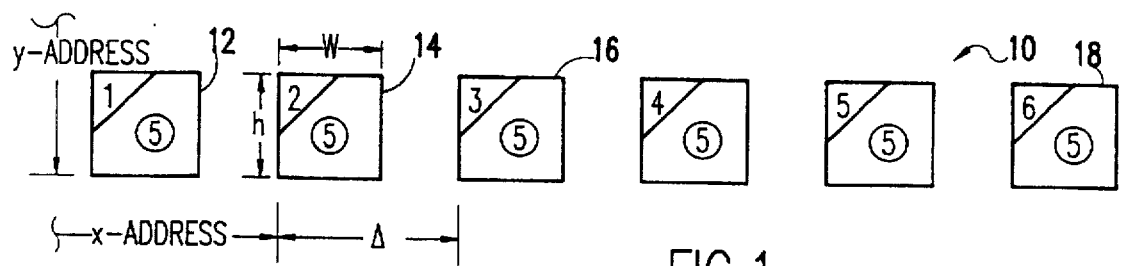

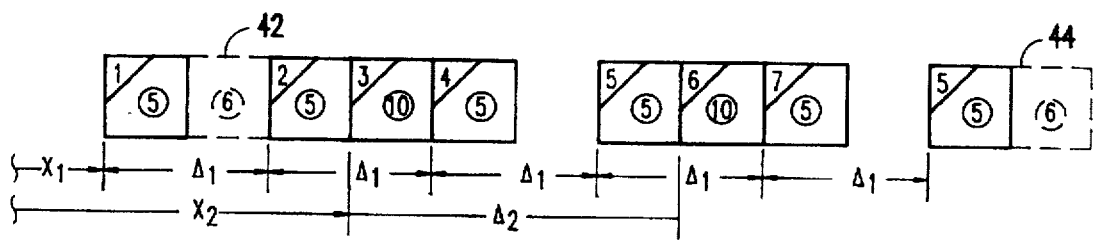

FIG.4

| SHAPE 1 | $X_1$ | $Y_1$ | $H_1$ | $W_1$ | $DOSE_1$ | ⎫ |
|---|---|---|---|---|---|---|
| SHAPE 2 | $X_2$ | $Y_2$ | $H_2$ | $W_2$ | $DOSE_2$ | |
| SHAPE 3 | $X_3$ | $Y_3$ | $H_3$ | $W_3$ | $DOSE_3$ | |
| SHAPE 4 | $X_4$ | $Y_4$ | $H_4$ | $W_4$ | $DOSE_4$ | ⎬ 48 BYTES |
| SHAPE 5 | $X_5$ | $Y_5$ | $H_5$ | $W_5$ | $DOSE_5$ | |
| SHAPE 6 | $X_6$ | $Y_6$ | $H_6$ | $W_6$ | $DOSE_6$ | |
| SHAPE 7 | $X_7$ | $Y_7$ | $H_7$ | $W_7$ | $DOSE_7$ | |
| SHAPE 8 | $X_8$ | $Y_8$ | $H_8$ | $W_8$ | $DOSE_8$ | ⎭ |

FIG.5

| MAJOR GROUP | Minor Group 1 | STEP 6 | $X_1$ | Y | H | W | $\Delta_1$ | 12 BYTES | 20 BYTES |
|---|---|---|---|---|---|---|---|---|---|
| | | DOSE 1 | DOSE 2 | DOSE 4 | DOSE 5 | DOSE 7 | DOSE 8 | | |
| | Minor Group 2 | STEP 2 | $X_2$ | Y | H | W | $\Delta_2$ | 8 BYTES | |
| | | DOSE 3 | DOSE 6 | | | | | | |

FIG.6A

| MAJOR CHAIN | Minor Chain | STEP 6 | $X_1$ | Y | H | W | DOSE ⑤ | $\Delta_1$ |
|---|---|---|---|---|---|---|---|---|
| | Minor Chain | STEP 2 | $X_2$ | Y | H | W | DOSE ⑩ | $\Delta_2$ |

FIG.6B

| UNORDERED LIST OF SHAPES WHICH ARE INPUT TO THE SORT ||
|---|---|
| X-Coord | Dose |
| 179194 | 27 |
| 180286 | 27 |
| 181378 | 27 |
| 182470 | 27 |
| 183562 | 27 |
| 184654 | 27 |
| 185746 | 27 |
| 171350 | 26 |
| 172470 | 25 |
| 173590 | 25 |
| 174710 | 26 |
| 175830 | 27 |
| 176950 | 27 |
| 168150 | 25 |
| 186706 | 25 |
| 169270 | 26 |

FIG.10

| MAJOR STEPPING CHAINED LIST, AS WELL AS FIRST MINOR CHAIN LIST ||
|---|---|
| X-Coord | Dose |
| 168150 | 25 |
| 172470 | 25 |
| 173590 | 25 |
| 186706 | 25 |

FIG.11

| DELTA LIST ASSOCIATED WITH THE FIRST MINOR LINKED LIST ||
|---|---|
| DELTA | Number of Stepping Candidates |
| 1120->(173590-172470) | 2 |
| 4320->(172470-168150) | 2 |
| 9760 | Ignored |
| 14236 | Ignored |
| 13116 | Ignored |
| 18556 | Ignored |

FIG.12

| SECOND MINOR CHAIN LIST ||
|---|---|
| X-Coord | Dose |
| 169270 | 26 |
| 171350 | 26 |
| 174710 | 26 |

FIG.13

| DELTA LIST ASSOCIATED WITH THE SECOND MINOR LINKED LIST ||
|---|---|
| DELTA | Number of Stepping Candidates |
| 2080 | 2 |
| 3360 | Ignored |
| 5440 | Ignored |

FIG.14

| MAJOR STEPPING CHAINED LIST AFTER 2nd MINOR CHAIN LIST IS PROCESSED ||
|---|---|
| X-Coord | Dose |
| 168150 | 25 |
| 172470 | 25 |
| 173590 | 25 |
| 186706 | 25 |
| 169270 | 26 |
| 171350 | 26 |
| 174710 | 26 |

FIG.15

| THIRD MINOR CHAIN LIST ||
|---|---|
| X-Coord | Dose |
| 175830 | 27 |
| 176950 | 27 |
| 179194 | 27 |
| 180286 | 27 |
| 181378 | 27 |
| 182470 | 27 |
| 183562 | 27 |
| 184654 | 27 |
| 185746 | 27 |

FIG.16

| DELTA LIST ASSOCIATED WITH THE THIRD MINOR LINKED LIST ||
|---|---|
| DELTA | Number of Stepping Candidates -->First X-coord |
| 1092 | 7-->179194 |
| 1120 | 2-->175830 |
| 2184 | Ignored |
| 2244 | Ignored |
| 3276 | Ignored |
| 3336 | Ignored |
| 3364 | Ignored |
| 4368 | Ignored |
| 4428 | Ignored |
| 4456 | Ignored |
| 4520 | Ignored |
| 5460 | Ignored |
| 5548 | Ignored |
| 5640 | Ignored |
| 6612 | Ignored |
| 7732 | Ignored |
| 8796 | Ignored |
| 8824 | Ignored |
| 9916 | Ignored |

(min=7 for 2184–4520; min=3 for 5460–9916)

FIG.17

| THIRD MINOR CHAIN LIST MINUS PREVIOUS IDENTIFIED STEPPED SHAPES ||
|---|---|
| X-Coord | Dose |
| 175830 | 27 |
| 176950 | 27 |

FIG.18

| MAJOR STEPPING CHAINED LIST AFTER ALL MINOR CHAIN LISTS ARE PROCESSED ||
|---|---|
| X-Coord | Dose |
| 168150 | 25 |
| 172470 | 25 |
| 173590 | 25 |
| 186706 | 25 |
| 169270 | 26 |
| 171350 | 26 |
| 174710 | 26 |
| 175830 | 27 |
| 176950 | 27 |

FIG.19

| DELTA LIST ASSOCIATED WITH THE MAJOR LINKED LIST ||
|---|---|
| DELTA | Number of Stepping Candidates -->First X-coord |
| 1120 | 6-->171350 |
| 2080 | 2-->169270 |
| 2240 | 3-->171350 |
| 3200 | 2-->168150 |
| 3360 | 2-->171350 |
| 4320 | Ignored |
| 4480 | Ignored |
| 5440 | Ignored |
| 5600 | Ignored |
| 6560 | Ignored |
| 7680 | Ignored |
| 8800 | Ignored |
| 9756 | Ignored |
| 10876 | Ignored |
| 11996 | Ignored |
| 13116 | Ignored |
| 14236 | Ignored |
| 15356 | Ignored |
| 17436 | Ignored |
| 18556 | Ignored |

FIG.20

| MAJOR STEPPING CHAINED LIST AFTER FIRST STEPPED SHAPE PROCESSED ||
|---|---|
| X-Coord | Dose |
| 168150 | 25 |
| 186706 | 25 |
| 169270 | 26 |

FIG.21

| Ncdata Generate With Stepping, Y=135750, W=160, H=44 | |
|---|---|
| Shapes | Number of Bytes |
| Shape X=179194, Dose=27 | 4 Bytes |
| Step & Repeat Delta=1092 Number of Occurrences=6 | 5 Bytes |
| Shape X=171350, Dose=26 | 6 Bytes |
| Step & Repeat Delta=1120 Number of Occurrences=5 | 5 Bytes |
| DOSEMERGE Command=26,25,25,26,27 | 8 Bytes |
| Shape X=168150, Dose=25 | 6 Bytes |
| Shape X=186706, Dose=25 | 5 Bytes |
| Shape X=169270, Dose=26 | 6 Bytes |

FIG.22

| Ncdata Generated Without Stepping, Y=135750, W=160, H=44 | |
|---|---|
| Shapes | Number of Bytes |
| Shape X=168150, Dose=25 | 6 Bytes |
| Shape X=172470, Dose=25 | 4 Bytes |
| Shape X=173590, Dose=25 | 4 Bytes |
| Shape X=186706, Dose=25 | 5 Bytes |
| Shape X=169270, Dose=26 | 6 Bytes |
| Shape X=171350, Dose=26 | 4 Bytes |
| Shape X=174710, Dose=26 | 4 Bytes |
| Shape X=175830, Dose=27 | 5 Bytes |
| Shape X=176950, Dose=27 | 4 Bytes |
| Shape X=179194, Dose=27 | 4 Bytes |
| Shape X=180286, Dose=27 | 4 Bytes |
| Shape X=181378, Dose=27 | 4 Bytes |
| Shape X=182470, Dose=27 | 4 Bytes |
| Shape X=183562, Dose=27 | 4 Bytes |
| Shape X=184654, Dose=27 | 4 Bytes |
| Shape X=185746, Dose=27 | 4 Bytes |

FIG.23

Comparison Made Between Stepping in Y and No Stepping of Data.

| DEVICE TECHNOLOGY | Byte Count | | | Stepped Shape Count | | | | | CPU for Stepping Only |
|---|---|---|---|---|---|---|---|---|---|
| | No Stepping | Stepping | Delta | # Shapes Stepped | % of Pattern Stepped | Max Step Shape | Ave Shape/ Step Cmd | | |
| A | 238960 | 223241 | -6.5% | 6627 | 14.6% | 17 | 4.5 | | 0m2s |
| B | 5832152 | 4371682 | -25% | 426801 | 80.7% | 49 | 14 | | 0m32s |
| C | 14663485 | 14420795 | -1.6% | 86758 | 3.8% | 7 | 4.2 | | 0m7s |
| D | 10484488 | 7804246 | -25.5% | 828482 | 45.6% | 42 | 5.2 | | 0m8s |
| E | 6609946 | 1934279 | -70.7% | 1398285 | 91.5% | 17 | 12.2 | | 1m27s |
| F | 12930078 | 4979088 | -61.5% | 2368678 | 86.7% | 17 | 11.2 | | 1m57s |
| G | 32505242 | 30241285 | -7.0% | 804161 | 13.2% | 15 | 6.4 | | 0m48s |
| H | 5875795 | 2928435 | -50.2% | 836387 | 61.8% | 178 | 17.9 | | 18m51s |

FIG.24

METHOD AND APPARATUS FOR AUTOMATICALLY RECOGNIZING REPEATED SHAPES FOR DATA COMPACTION

CROSS REFERENCE TO RELATED APPLICATION

This application is a divisional of application Ser. No. 08/062,629 filed May 18, 1993, now U.S. Pat. No. 5,481,472.

BACKGROUND OF THE INVENTION

1. Field of the Invention

The present invention generally relates to data compaction by the recognition and detection of repeated patterns in either data or physical characteristics described by such data and, more particularly, to the compaction of data descriptive of shapes into which a pattern of, for example, conductive material may be dissected for purposes of reproduction under automated machine control.

2. Description of the Prior Art

Many manufacturing processes include a significant number of repeated sequences of actions. Particularly in the semiconductor industry, a particular pattern of more or less high complexity will be reproduced many times on the same wafer by a step-and-repeat procedure. While such a step-and-repeat process often involves an exposure of a sensitized surface to radiation with the pattern established by a mask, the same type of operation could readily be performed by a direct write operation using light (e.g. from a laser) or an electron beam. In this latter case, the amount of data required for reproduction of the entire pattern (or a portion thereof since more than one pattern could contribute to the entire final pattern) by repetitions of a basic pattern is reduced by an amount equal to the product of the number of repetitions of the pattern and the amount of data required to describe the basic pattern, usually leading to significant data reductions.

In modern semiconductor integrated circuit manufacturing processes, lithographic techniques are often employed to develop patterns which will form the various circuit elements of an integrated circuit and connections therebetween. While a plurality of chips may be formed on a wafer by a step and repeat exposure for each chip or each portion thereof at the chip level, desired patterns of the chip, itself, are often formed by dissection of the pattern into abutting elemental areas, predominantly rectangular in shape, and using an automated exposure tool to form each elemental shape in a high-speed sequence of individual exposures in response to numerical control data (NCdata).

However, as integrated circuits have become more complex and constructed at higher densities and smaller feature sizes, the number of such elemental areas has become very large, often requiring hundreds of thousands if not millions of exposures. In the past, this number of elemental areas was often reduced to more manageable numbers by limiting proximity correction (exposure correction for the exposure "dose" an area may receive due to certain imperfections in the exposure system such as secondary emission and other electron scattering effects in electron beam lithography exposure tools) and assigning a common dose to many contiguous elemental areas which can then be produced by a plurality of step and repeat operations at the same dose in order to form a continuous shape. In such a case, the step and repeat operations can be directly defined from shape length and can be assumed without detection if the rectangle has a dimension greater than an optimum spot size (maxspot) of the tool.

A further complicating factor, particularly in regard to e-beam tools is the fact that materials which are sensitive to e-beam exposure will exhibit "blooming", if overexposed; causing loss of precision in the location of edges of the pattern. Therefore, even though shapes may be repeated with great regularity in some patterns, it is likely that individual spots in any sequence of spots will require different exposure doses and thus cannot be produced by a regular step-and-repeat procedure.

While it is desirable to "saturate" or fully expose resist or other exposure-sensitive materials to obtain full contrast for the pattern but recognizing the tendency of such materials to exhibit "blooming" if overexposed, a proximity correction system and methodology has been developed, as disclosed in U.S. patent application Ser. No. 008/010,715, now abandoned in favor of U.S. Pat. No. 08/298,971, now U.S. Pat. No. 5,432,714, filed Jan. 29, 1993, by Stuart et al., which is assigned to the assignee of the present invention and fully incorporated by reference herein. This technique compensates for the potential for overexposure of areas due to secondary emission and scattering effects in e-beam tools from neighboring exposed areas of the pattern (referred to as proximity correction) so that elemental areas can be correctly exposed (e.g. fully proximity corrected to any desired degree of exposure accuracy) while still maintaining the volume of data to a minimum. This technique, however, because of the greater exposure accuracy provided, increases the number of rectangles (e.g. each rectangle being composed of one or more elemental rectangular areas having the same computed exposure dose) over the prior, less accurate techniques of limited proximity correction in which simplifying assumptions are employed to limit the data volume.

This increase in the number of areas receiving different doses infers a similar increase in the number of rectangle descriptions and a decrease in the number of contiguous step-and-repeat operations possible at the same dose. Also, improved accuracy of proximity correction during tiling or filling of areas, such as near the borders of pads and conductor runs in the vicinity of pads, under stringent design rules, implies a likelihood of similar elemental area exposures which are not contiguous at a particular exposure dose and for which no efficient or effective detection or data compaction technique currently exists. Accordingly, the problem of manipulation of a great quantity of data with sufficient speed to control an exposure tool with throughput sufficient to a manufacturing application remains very difficult.

Regardless of how the final pattern is ultimately achieved, a basic pattern must be formed. In present-day integrated circuits of high complexity and integration density an initial layout pattern for a mask or other physical pattern to be produced is preferably directly written into a resist coating on a wafer or other material from which a mask is to be formed by a tool such as an electron beam lithography exposure apparatus, hereinafter referred to as an e-beam tool (or, more generally, "exposure tool"). Whether the exposure is by an electron beam or other form of energy, the exposure tool directs such energy at high speed to a long sequence of very small areas on the surface to be exposed under automated control and thus builds up a pattern from a large plurality of exposed (generally rectangular) spots. These spots will be located in accordance with the design of the pattern and also have particular addresses corresponding to a corner, center or other location in accordance with some convention. Otherwise, the spots must be considered as being randomly located for generality of reproducible patterns.

In view of the complexity of present-day integrated circuits, a basic pattern may include tens or hundreds of millions of such exposure spots. Therefore, while the description of such spots may be relatively simple in comparison with even a simple basic pattern, the number of spots to be exposed constitutes an enormous volume of data for each pattern. When it is considered that each byte of such data must be transferred to at least one register is order to control the exposure tool and that such transfer requires a finite amount of time, it can be understood that the volume of data needed to define a basic pattern can easily cause a substantial amount of processor overhead unless some data compaction is possible. Further, the amount of storage required for a list of the exposure spots often limits the number of patterns which may be cost-effectively stored in memory of an automated exposure tool.

SUMMARY OF THE INVENTION

It is therefore an object of the present invention to provide a method and apparatus for recognizing repeated patterns in a stream of data.

It is another object of the invention to provide a method and apparatus for compaction of data by recognizing portions of a body of data which can be at least partially described by specification of a step and repeat procedure.

It is a further object of the invention to provide an enhancement of control of an automated tool, particularly for control of a pattern by exposure to an electron beam, by compression of data having recurrent patterns therein.

It is another further object of the invention to provide a step-and-repeat technique for application to the formation of patterns formed of exposure spots which may have different assigned exposure doses.

It is yet another object of the invention to provide a highly efficient analysis technique for extraction of data which can be represented by step-and-repeat operations from a large volume of individual spot data.

It is a yet further object of the invention to provide a technique of data compaction for control of an exposure tool and, in particular for an e-beam tool.

In order to accomplish these and other objects of the invention, a method of generating descriptions of step-and-repeat operations for compaction of data having at least an address and at least first, second and third parameters and containing repeated patterns is provided, comprising the steps of forming a list of portions of the data having at least one common first parameter, forming an ordered list from the portions of said data in accordance with second and third parameters of the data, determining displacements between members of the ordered list from values of the third parameter of the data, incrementing an address of a member of the ordered list by at least one displacement to obtain a further address, detecting if a member of the ordered list has the further address, and, if a member of the ordered list has the further address, incrementing a step count and repeating the incrementing step, from the further address and the detecting step, and, if a member of the ordered list is not found, removing the member of the ordered list which has been incremented by the incrementing step and all members of the ordered list which have been detected by the detecting step from the ordered list and forming a coded description of the members of the ordered list which have been removed by the removing step using at least the second parameter and the step count.

In accordance with another aspect of the invention, a method of generating descriptions of step-and-repeat operations for compaction of data having at least an address and at least first, second and third parameters and containing repeated patterns is provided, comprising the steps of forming a list of portions of the data having at least one common first parameter, forming an ordered list from the portions of the data in accordance with second and third parameters of the data, forming a truncated list of members of the ordered list having a consistent value of the second parameter of the data, determining displacements between members of the truncated list, incrementing an address of a member of the truncated list by at least one displacement to obtain a further address, and detecting if a member of the truncated list has that further address, and if a member of the truncated list has that further address, incrementing a step count and repeating the incrementing step, from that further address, and said detecting step, and, if a member of the truncated list is not found, removing the member of the truncated list which has been incremented by the incrementing step and all members of the truncated list which have been detected by the detecting step from the truncated list and forming a coded description of the members of said truncated list which have been removed by said removing step using said first and second parameters and said step count.

In accordance with a further aspect of the invention, a method of compressing numerical control data is provided, comprising the steps of extracting at least one major list of data having identical values of at least one first parameter, extracting at least one minor list from the major list having identical values of a second parameter, determining displacements between members of the minor list, generating a step-and-repeat command descriptive of at least a minimum number of members of the minor list for which the displacements are identical, and removing members of the minor list which are described by said step-and-repeat command from the major list.

In accordance with yet another aspect of the invention, an apparatus is provided for compressing numerical control data comprising a first comparison arrangement for extracting at least one major list of data having identical values of at least one first parameter, a second comparison arrangement for extracting at least one minor list from said major list having identical values of a second parameter, an arrangement for determining displacements between members of said minor list, an arrangement for generating a step-and-repeat command descriptive of at least a minimum number of members of said minor list for which said displacements are identical, and an arrangement for removing members of said minor list which are described by said step-and-repeat command from said major list.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a one-dimensional array of exposure spots useful in understanding a first example of the function of the invention, FIG. 2 is a representation of coded information bytes necessary to describe the individual exposure spots of FIG. 1, FIGS. 3A and 3B are representations of the information of FIG. 2 compacted in accordance with the invention, FIG. 4 is a one-dimensional array of exposure spots useful in understanding a second example of the function of the invention, FIG. 5 is a representation of coded information bytes necessary to describe the individual exposure spots of FIG. 4, FIG. 6A and 6B are representations of the information of FIG. 5 after compaction and illustrative of major and minor chains in accordance with the invention, FIG. 10 is an example of unordered list of shapes on which the invention is to operate, FIG. 11 is the major stepping chain and first minor chain list at a first dose among the shapes in FIG. 10, FIG. 12 is a delta list corresponding to FIG. 11, FIG. 13 is a second minor chain list for a different dose among the shapes of FIG. 10, FIG. 14 is a delta list corresponding to FIG. 13, FIG. 15 is the major chained list after processing of the second minor chain list of FIG. 13.

FIG. 16 is a third minor chain list at a third dose from among the shapes in the list of FIG. 10, FIG. 17 is a delta list derived from FIG. 16, FIG. 18 is the portion of FIG. 16 remaining after removal of a chain of stepped shapes, FIG. 19 is the major stepping chain list after addition of the shapes of FIG. 18, FIG. 20 is the delta list associated with the major linked list of FIG. 19, FIG. 21 is the portion of FIG. 19 remaining after removal of a chain of stepped shapes, FIG. 22 is a list of the data representing the shapes of FIG. 10 as compressed by operation of the invention, FIG. 23 is a list of uncompressed data corresponding to the shapes listed in FIG. 10, for comparison with FIG. 22, and FIG. 24 is a summary of the performance of the invention on eight exemplary data sets.

DETAILED DESCRIPTION OF A PREFERRED EMBODIMENT OF THE INVENTION

Figure 7:
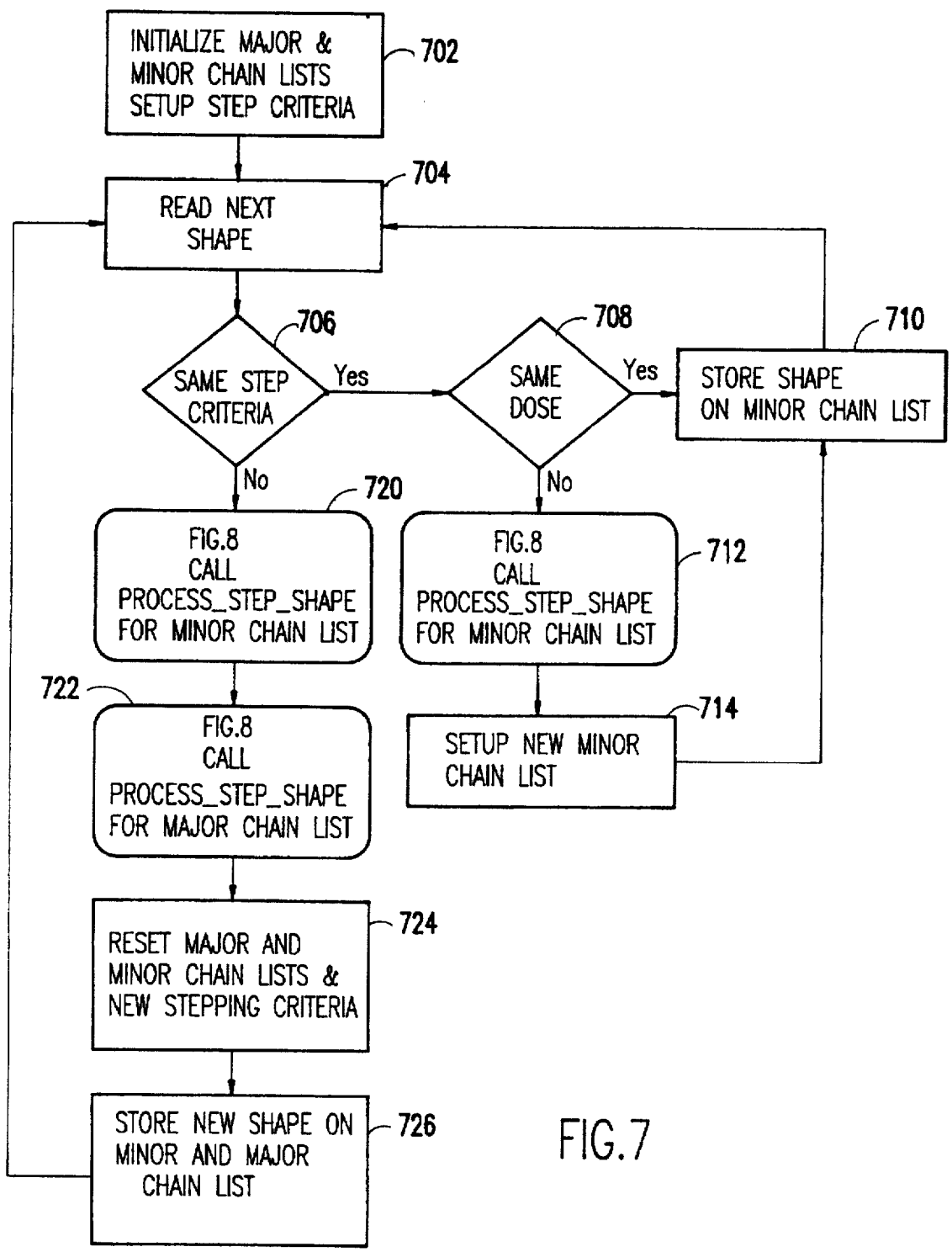
FIGS. 7, 8 and 9 are flow charts illustrating the operation of the invention.

Referring now to the drawings, and more particularly to FIG. 1, there is shown a one-dimensional array 10 of exposure spots 12, 14, 16, 18 which are equally spaced and can readily be reproduced by a step-and-repeat operation. For simplicity in this example, each exposure spot has the same width, w, height, h, and assigned dose (in this example "5" depicted within a circle). Also, since this is a one-dimensional array, one of the two coordinate addresses, in this example, y, will be the same for all exposure spots. The addresses in the other coordinate direction will, of course, be different for each exposure spot. For convenience, each spot may also have an identification code assigned which is depicted in the upper left corner of each exposure spot with numbers 1–6.

Adoption of design rules which specify minimum feature sizes, minimum conductor separations and the like, in the development of integrated circuits, imply some regularity of "step" between exposure spots and the possibility of some degree of data compaction by applying a step-and-repeat techniques to the data for forming a basic or any other pattern. However, the volume of data which may be involved has prevented efficient analysis of the data to discover where step-and-repeat procedures are possible. That is, the computational burden in the analysis is often greater than the processor overhead involved in the control of the exposure tool in accordance with individual spot description data.

It is to be understood that while the present invention will be hereinafter described in detail in connection with control of an e-beam tool for the manufacture of integrated circuits, the methodology and apparatus of the present invention is applicable to many fields of endeavor. For example, the ability to recognize patterns within a body of data is often basic to the efficiency of operations on that data and even an understanding of the data. For example, many encryption and decryption techniques depend, to a greater or lesser extent, on statistical correlation of patterns within data, such as correlation between data patterns in clear data with patterns in encrypted data or repeated patterns within the data. Character or pattern recognition is another example where correlations of data with archetypical templates allows substitution of code representative of the identity of a pattern for the data (e.g. pixels) representing the pattern itself. The substitution of such a code for the pattern data is a form of data compaction since many fewer code elements are required to identify the archetype of a pattern than are required to form the archetype or any recognizable variant thereof.

Many manufacturing processes also may be simplified by the recognition of patterns. Often, the object of the process is primarily defined in terms of a length of repeat such as in automated looms for the production of patterned textiles or printers for the production of patterned sheet material such as flooring and wallpaper. Other manufacturing processes are intrinsically iterative but may be simplified by pattern recognition. That is, each parameter of the operation must be specified each time the operation is performed but, for identical repetitions, the parameters, or at least one of the parameters, need only be specified once.

For example, as shown in FIG. 2, the array of exposure spots shown in FIG. 1 may be individually described. Assuming a byte of data for each descriptor, each individual exposure spot will require at least five and preferably six bytes of data (x, y, h, w, dose, and, optionally, an identification code). However, as noted above, for this particular, special case, array of exposure spots, y, h, w and dose are the same. Further, the x-addresses differ by a fixed amount, Δ, from one exposure spot to the next and thus the addresses may be specified by a beginning address, the number of the exposure spots and Δ.

It is to be understood that it is unimportant to the invention which of two coordinate directions is chosen as a stepping direction. It is also possible, within the principles and methodology of the present invention to perform stepping diagonally where a consistent spacing increment is found in both the x and y coordinate directions. Other coordinate systems such as a polar coordinate system could also be employed with step-and-repeat operations performed in the radial or angular directions or both. Nevertheless, such variations generally result in complexities which, while readily overcome by suitable additional data search and sorting operations for a plurality of variables, are invariably more complex and require more computing overhead than conversion of addresses to align the step-and-repeat operations to a single coordinate direction. Therefore, performing the methodology of the invention holding one of the coordinate addresses constant and identifying exposure spot candidates within the context of a one-dimensional format (the invariant coordinate address being referred to as a base coordinate) is considered to be much preferable to other possible variations and, as such, will be hereinafter described in detail. Implementation of variations such as those indicated above will be readily apparent to those skilled in the art in view of that description.

One form of compacted coding of descriptor data is shown in FIG. 3A. This compacted coding has two portions 32, 34. A first portion 32 is in the form of a step-and-repeat command including a byte (or other data unit, such as two bytes) 36 indicating the number of repeats which are to be performed and the parameters (e.g. arguments) of initial x, initial y, w, h, and $\Delta$. The second portion of the compacted coding includes a byte (or other unit) of data indicating an assigned does for each step-and-repeat operation. This compacted coding format would provide full generality as to dose and could accommodate different assigned exposure doses for each exposure spot.

However, in this special case, since all the exposure doses are the same, further data compaction is possible, as shown in FIG. 3B which is included in the preferred embodiment of the invention. In this case, a full and sufficient description of the array of exposure spots shown in FIG. 1 can be provided in seven bytes consisting of a specification of the number of step-and-repeat operations ("step6"), x, y, h, w, and dose of the first exposure spot and $\Delta$. Therefore, in this special case where full repeatability is present, compaction is possible to reduce the amount of data by more than 75%. This degree of data compaction will vary widely with the degree of repeatability and the number of repeated shapes (which may be formed as a chain or described by a single descriptor) presented by the exposure spots for any particular pattern. For example, if the number of repeated shapes were sufficiently great (e.g. over one hundred fifteen for this code format) in a fully repetitive pattern, compaction could exceed 99%.

Referring now to FIG. 4, a second, more general, example will be discussed. In this case, eight exposure spots are presented. While the spots in the array are not evenly spaced and have different assigned doses, a high degree of repeatability remains present: h, w, and y are constant and exposure spots 1, 2, 4, 5, 7 and 8 have the same assigned dose and are equally spaced by an address interval $\Delta_1$, beginning at address $x_1$ and exposure spots 3 and 6 are also equally spaced by an address interval $\Delta_2$, beginning at address $x_2$. As in FIG. 2, individual descriptions of the eight spots require forty-eight bytes for descriptors if an identification is included, as shown in FIG. 5. As shown in FIG. 6A, a form of data compaction corresponding to the compaction of FIG. 3A, provides two step-and-repeat operations differing by the value of $\Delta$ (e.g. $\Delta_1$ and $\Delta_2$ will have different values. This form of data compaction in this more general but still highly repetitive case yield a compaction of about 50% or somewhat more. Note also that the number of bytes in each of the step-and-repeat operations (referred to as minor group 1 and minor group 2 for comparison with "minor chains" in FIG. 6B) is not consistent in format due to the different number of exposure spots at each repeated spacing.

FIG. 6B shows the compaction of descriptor data done in the same manner as FIG. 3B, with two seven-byte words of consistent format, each representing what will be referred to hereinafter as a minor chain. A minor chain, by definition, initially includes exposure spots which are consistent in x or y, h, w and dose. A major chain preferably may include one or more minor chains, each of which is consistent in x or y, h, w and dose, and one or more individual spots, such as are indicated by dashed lines and dosage of 6 and 42 and 44, having the same address in either x or y. Thus the major chain may include a plurality of different chains having the same x or y, h, and w but different values of $\Delta$ and different dosages, as well as individual exposure spots.

The basic difference between the two forms of coding illustrated in FIGS. 3B and 6B in comparison with that shown in FIGS. 3A and 6A lies in the generality of the minor groups (FIGS. 3A and 6A) for accommodating differing exposure dosages for each exposure spot while the minor chains are each specific to a particular dose as well as x or y, h, and w. Accordingly, it is an important feature of the present invention to analyze the exposure spot descriptor data in a manner whereby minor chains having consistent exposure dosage are developed. Because coding shapes with varied doses is more expensive in byte count, shapes are first divided in groups of minor chains which will have common x or y, w, h and dose. All pertinent compaction will first be done at this level (by $\Delta$). Then, in accordance with the invention, the analysis moves up to the major chains where the shapes are defined by common x or y, w and h only. During the processing of any chains (major or minor), a delta ($\Delta$) list is generated for that chain to determine optimum stepping candidates, as will be discussed in greater detail below. While the degree of compaction possible will vary from pattern-to-pattern and will usually be far less than the degree exhibited by the fully or highly repetitious patterns of FIGS. 1 and 4, the form of data compaction derived by preferentially sorting by exposure dose will usually but not always yield a greater degree of data compaction than preferentially sorting by $\Delta$, particularly in the types of patterns encountered in integrated circuit manufacture. For example, an equally spaced array of spots, each spot having a different dose could not be compacted in the format of FIG. 6B (e.g. would yield no data reduction) although significant data reduction would result in the format of FIG. 6A. Therefore, both forms of compaction are considered to be within the scope of the present invention and it is an important feature of the invention that both coding formats can be produced by the operation of the invention, depending on which will yield the greater degree of data compaction.

Referring now to FIG. 7, the methodology of the recognition of step-and-repeat operation candidates will be discussed in detail. The first step of the analysis process is to establish initial conditions 702 for the major and minor lists which will form the basis of the compacted coding format. It is important to understand that in accordance with a preferred form of the invention, the major and first minor list will be the same list and, for purposes of convenience during analysis will be treated as a single major list and a single minor list. This list will be unordered and similar to the list illustrated in FIG. 10.

Figure 8:
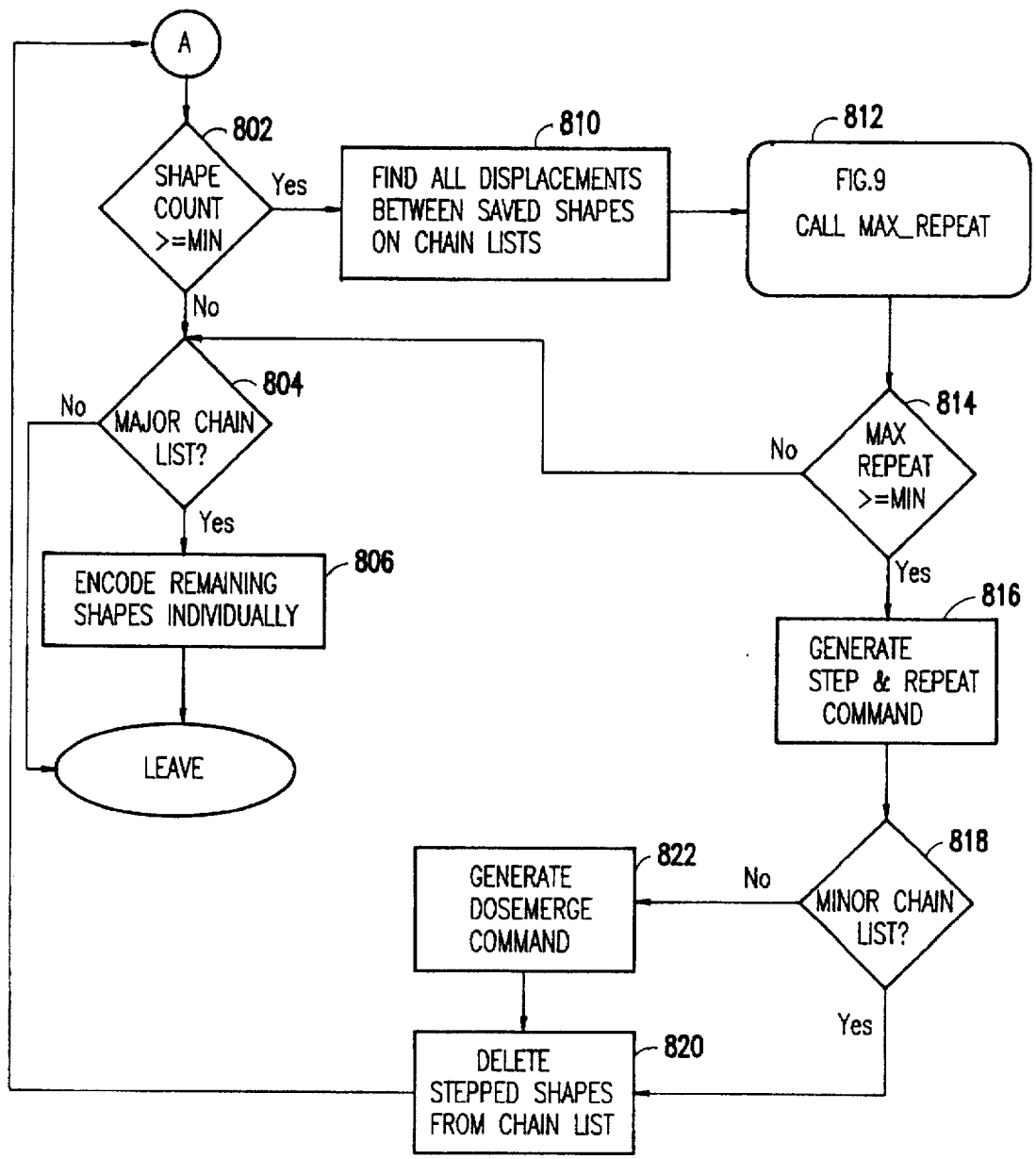
Figure 9:
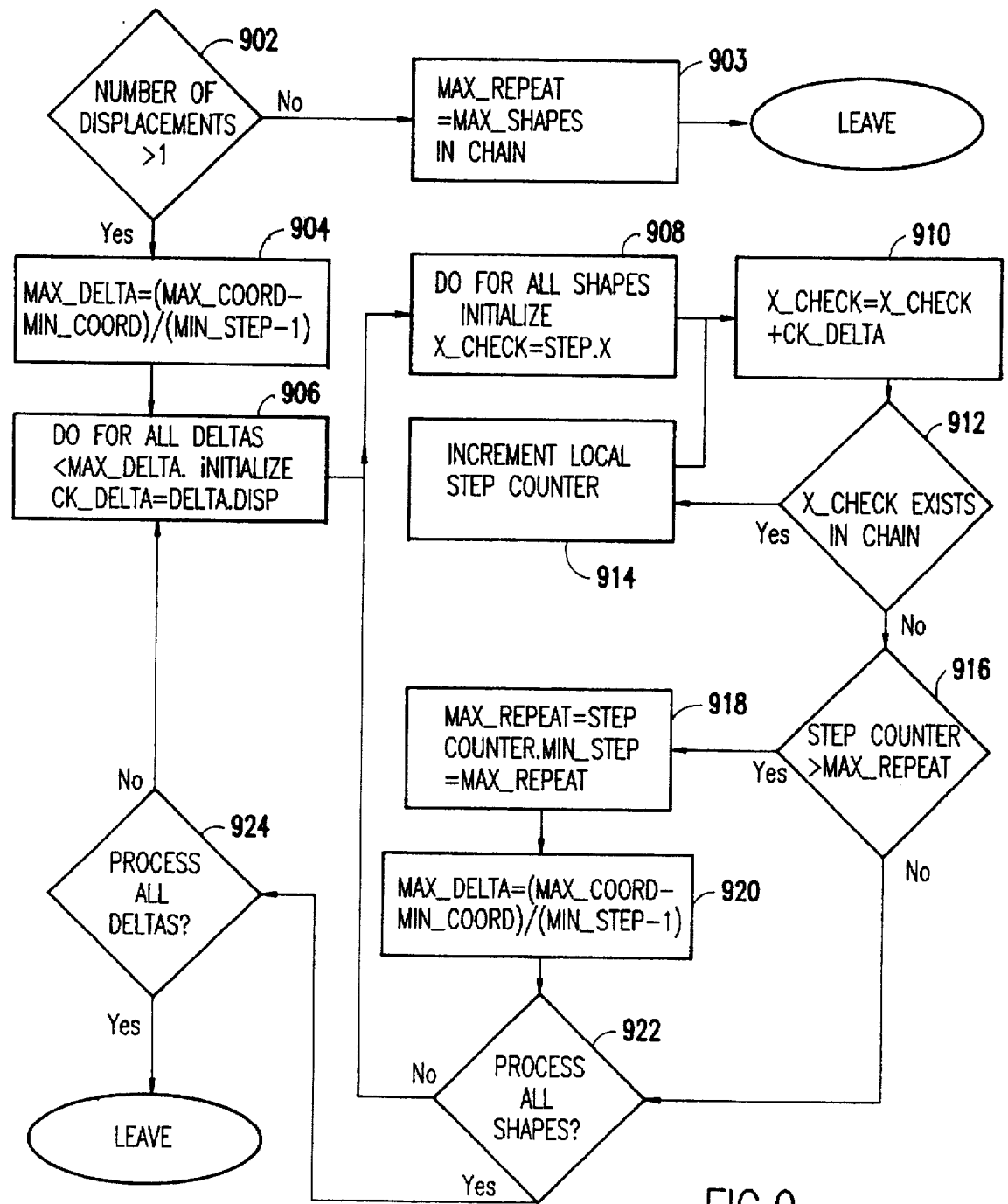

Incidentally, FIGS. 10–23 illustrate a single example of the operation of the invention and will be referred to as appropriate during the discussion of FIGS. 7–9. This example is based on realistic pattern data and the numbers provided reflect the general magnitude of numbers which are encountered in integrated circuit manufacturing processes. For purpose of this example, data was extracted from pattern data having y=135750, h=44 and w=160. the variables for the analysis are therefore x and dose and the data is being analyzed for the $\Delta$ which will yield the greatest amount of data reduction from the list of FIG. 10 into minor lists. The removal of data into minor lists provides somewhat more data compaction and ease and speed of control of the exposure tool since minor lists, after the analysis is complete, can be executed without alteration of dose, whereas a major chain will almost always include exposure spots of differing doses, requiring an additional command (referred to as a DOSEMERGE command) to be additionally executed.

This unordered list is the preferably sorted in order of ascending dose and then ascending address of x-coordinate for each dose once the data has been extracted from the list of exposure spots meeting criteria for performance of step-and-repeat operations, preferably consistent in h, w, and base coordinate, as above. During this sorting process, pointers are preferably developed, in a manner well-understood in the art, so that the result of the sorting operation will be in the form of a linked list. Once the exposure spots are sorted in address order by dose, they are read one-at-a-time at step 704 beginning with the lowest dose. Incidentally, it is convenient for accommodation of initial conditions to provide that the branching conditions at steps 706 is considered to be not met if insufficient previous shapes have been processed to form the basis of a comparison. This can be the result of a change in x or y, h, or w. Thus, a dose value for a minor chain will be established by the first shape read in accordance with the subroutines of FIGS. 8 and 9, processing the minor chain list(s) and then the major chain lists. This also provides, in subsequent steps when the step criteria changes, an analysis on the minor chain lists or minor and major chain lists, in sequence, to optimize the step criteria and ultimately to generate the step-and-repeat operation commands.

Referring now to FIG. 8, a branch to 720 of FIG. 7 at step 706 causes the subroutine of FIG. 8 to be invoked. At this point, after sorting the unordered list of FIG. 10, the entries, in ascending address order and at the lowest dose will appear as shown in FIG. 11. This is a minor stepping chained list (minor chaining preferably being in order of increasing dose values). Step 802 determines from the list if stepping is possible by checking the number of entries or shape count in the table of FIG. 11 against a minimum number which is set as three for a minor list and four for a major list. These minimum numbers are determined empirically or analytically (e.g. by inspection) to be the optimum minimum number of candidates for the particular data format or formats of compacted data. For the particular preferred data formats of FIGS. 6A and 6B, for example, it is readily determined that minimum numbers of 4 and 3, respectively, are numbers below which compaction would not be sufficiently significant to justify the processing required. That is, if the number of entries is too low (e.g. shape counts less than the minimum numbers would not result in significant data compaction), the shapes are encoded individually at step 806 if the list is a major list as determined at 804. If the list is a minor list, the subroutine of FIG. 8 is exited and the process of FIG. 7 resumes.

If, however, it is determined at 802 that stepping is possible, the addresses of all combinations of shapes in major or minor chains are subtracted in pairs to determine displacements between them at step 810, yielding a list of displacements such as that shown in FIG. 12, and the subroutine of FIG. 9 is invoked at step 812. The subroutine of FIG. 9 is considered to be an important feature of the present invention since it permits processing time to be greatly reduced by ignoring the majority of the displacements found in step 810.

As an overview of this process and with reference to FIG. 12, it should be noted that the range of address values in FIG. 11 is 18556. The maximum displacement which would allow at least three stepping candidates within this range is thus 18556/2=9278 (e.g. 3−1=2 displacements). Therefore, all but the smallest two address differences in FIG. 12 can be ignored, significantly reducing the processing time required. At the same time the displacements are found in developing the list of FIG. 12, the number of instances of each displacement are also accumulated and in this case, since there are only two shapes corresponding to each displacement, no significant net reduction of data would result from storing these shapes on a minor list. Therefore, the shapes are stored on the major list.

This general process is preferably accomplished by the process illustrated in more detail in FIG. 9. If there is only one shape displacement in the minor or major chain list (e.g. the first minor chain list of FIG. 11), the maximum repeat is set equal to the number of shapes in the chain at step 903 and the subroutine returns to the subroutine of FIG. 8. This avoids the need to calculate displacements for combinations where there are only two shapes in a list. If, however, two or more entries are found at step 902, the computation of a maximum delta is performed by subtracting the first (smallest) address in the list of FIG. 11 from the last (largest) address and dividing this difference by the minimum number of steps minus one at step 904. Then, at step 906, a variable, ck_delta is set equal to each displacement, in turn, if the displacement is less than the maximum delta computed which will can produce at least three candidate shapes. Then, for a first displacement, a variable X_check is set equal to step.x, the first step identified in the chain, to determine repeatability. Then the variable X_check is incremented by ck_delta at 910 and the chain is interrogated to determine if a shape having the updated address X_check exists on the chain. If it does, the local step counter is incremented to develop the number of step-and-repeat operations to be performed at step 914 and the process repeated, incrementing the address value and terminating the search when a shape is not present at the X_check address.

When a further shape to be chained with other shapes is not found, the step counter (incremented at 914 if one or more shapes were found) is interrogated at step 916 to determine if a minimum number of shapes were found (again, three for minor chains and four for major chains). If so, the maximum number of repeats is made equal to the value accumulated by the step counter and the minimum step is established which will yield the maximum number of repeats at 918. This is done to check other possible deltas within the minor chain list which may generate more step and repeat candidates than any delta which was previously processed for that chain. Then the maximum delta is recomputed based on the new minimum number of steps. If the step counter has not exceeded the maximum number of repeats previously found, the process branches to 922. If the end of the list of shapes (e.g. FIG. 11) has not been reached, as determined at 922, whether or not the maximum number of repeats has been exceeded the process loops to 908 and is repeated to possibly generate another chain at higher addresses.

When all shapes have been processed, as determined at 922, the process determines if all displacements actually found and which do not exceed the maximum delta which can provide a minimum of three step-and-repeat candidates have been examined and if so, the process returns to FIG. 8. If not, the next larger displacement is substituted for ck_delta and the process is repeated until all displacements have been tested for all shapes and all chains found. In this way only displacements which are actually present are checked for step-and-repeat candidates and may thus be executed very quickly since the list of displacements is usually short, particularly after ignoring larger displacements. This process also ignores less efficient minor chains to be processed within major chains when larger numbers of step-and-repeat operations are found to be possible with larger displacements.

Returning to FIG. 8 at the termination of step 812, it is then determined at step 814 if the maximum number of repeats, incremented by the process of FIG. 9 is greater than the minimum. If not, it is assumed that no suitable candidates for step-and-repeat operations were found in the chain. If the chain was a major chain, therefore, as determined at 804, the shapes are individually encoded at step 806. If the list is a minor list, nothing remains to be done and the process returns to the appropriate point of FIG. 7. If however, a sequence of candidates for step-and-repeat operations has been found during the process of FIG. 9, a step-and-repeat command is generated at 816 using the step counter value reached at 914 of FIG. 9, the minimum step arrived at in step 918 of FIG. 9 the h, w and base coordinate values and the beginning address for the chain found. Then, if the chain is a major list, a DOSEMERGE command is appended to cause the command format to follow that of FIGS. 3A or 6A, discussed above at 822. Then for either major or minor lists, the shapes in the chain are deleted from the chain list at 820 and the process repeated until all shapes have been sorted into minor or major lists.

Returning now to FIG. 7, the first shape in a list provides a reference address as well as establishing a first minor chain list, as discussed above, possibly causing removal of a minor chain of shapes from the list or appending shapes to the previously processed minor chain, identifying the start of a new minor chain with a different dose at a later step (810 of FIG. 8), which, together with subsequent steps, provides a verification that each step processed within a particular minor chain has the same x or y, w, h and dose.

Assuming that a similar step criteria (e.g. base coordinate width and height) is found, the dose of the most recently read point is compared at step 708 with the dose of the first minor chain list (and any other minor chains which have been generated by the second or subsequent shape at the time a particular shape is read) if the dose coincides with the dose of any presently existing minor chain list, the shape is stored on that list at step 710 and the process loops to 704 to read the next shape. If the dose has not been previously encountered, a subroutine shown in FIG. 8 is called at 712, which will be discussed in greater detail below, to process the minor chain lists. Then a new minor chain list is established at step 714 to contain the spot having a different assigned dose and which is stored therein at 710 as the process loops back to 704.

If a different stepping criteria (e.g. a different base coordinate, w or h) is found at 706, the subroutine of FIG. 8 is called to process the last minor chain list at 720 and then process the remaining shapes which make up the major chain list at 722. This combination of steps, as will be discussed below allows the nested major and minor chains to be analyzed and reset in accordance with more optimal stepping distances at step 724. The shape causing the branch to 720 at step 706 is then stored in the new major and minor chains at step 726 and the process loops back to 704 to read the next shape.

It should be appreciated from the foregoing that only three computations (the maximum delta which will yield significant net data compaction, the subtractions to find displacements and address incrementing by values of displacements found in order to identify members of the list which can be collectively described) are independently performed. The remainder of the operations are basic sorting operations which are, per se, well-understood in the art as are implementations in both special purpose hardware and software for general purpose computers. The meritorious effects of the present invention derive from the combination of these two simple and rapidly performed computations with sorting and data extraction or truncation criteria based on a sequence of parameters of the data and also from the perfecting features of the invention by which the search for data may be simplified and the number of operations reduced.

For example, the extraction of data having the same base coordinate, h and w, which may be considered to be at least one parameter, produces a relatively short unordered list. Sorting and truncation of the major list in order of a second, variable, parameter (dose) within that short list provides additional reduction of the data which must be analyzed in a minor list for displacements to determine if the coding format providing maximum compaction is applicable. If so, all data which can be so compacted is removed from the major list. When all possible compaction has been performed on minor chains and coding accomplished, the remaining data in the major list is analyzed for displacements, independently of the second parameter (dose). Thus, the number of data operated on during analysis for displacements is very much reduced and can be accomplished at very high speed. This meritorious effect of the invention is substantially realized even without truncation of the short list by specific, consistent value of the second parameter, as may even provide additional speed of execution in data sets corresponding to particular patterns with a high degree of dose variation. The perfecting feature of requiring a minimum number of step-and-repeat operations to be found and accumulating instances of particular displacements allows screening of data and the omission of many of the address incrementing operations in the analysis. The additional perfecting feature of calculating a maximum delta which can find a large enough number of spots to result in a net data reduction allows ignoring of many of the displacements to further increase processing speed.

While the process of the invention has been described in detail, it may be of assistance in understanding the invention to describe the remainder of the operation of the invention in regard to the sample shape list of FIG. 10. recapitulate it will be recalled from the example illustrated in FIGS. 10–12 that no compression was found possible in the first minor list of FIG. 11.

If a different dose is found in step 708 of FIG. 7, the processing of FIGS. 8 and 9 will again be invoked to develop another minor list at a new dose value within the major chain. Referring now to FIG. 13, the second minor chain list is shown, having a dose of 26. Detection of a different dose at 708 causes the analysis procedure of FIGS. 8 and 9 to be invoked, as described above for the first minor chain list. The maximum delta possible which would result in at least three stepped shapes being found would be (174710–169270)/(3–1)=2720. Therefore deltas greater than 2720 are ignored, as indicated in FIG. 14, shows the displacements computed from the addresses of FIG. 13. The only remaining displacement, 2080, occurs for only two shapes which is less than the minimum number. This condition is detected at 814 and causes branching to 804 and the shapes identified on the minor chain list are individually saved as part of the minor chain list, to be further processed later. The major stepping chained list after processing the second minor chain list now contains the shape data illustrated in FIG. 15.

The third and last (since there are only three doses represented in the unordered list of FIG. 10) minor list is shown in FIG. 16, containing the addresses of shapes having an assigned dose of 27. Since this dose differs from the preceding dose, branching again occurs at 708 to the processing of FIGS. 8 and 9. The displacements and maximum delta are again computed as before. The computed displacements are shown in FIG. 17. This time, the maximum delta is (185746−175830)/(3−1)=4958 and greater displacements (e.g. 5460 and greater, in FIG. 17) are initially ignored and processing of displacements begins.

When the third address (179194) in FIG. 16 is analyzed (910, 912, 914 of FIG. 9) for a delta or displacement of 1092 (the first displacement in FIG. 17), it is found that seven shapes can be eliminated from the minor chain list by step-and-repeat coding In the form of FIG. 3B and/or 6B. The maximum delta is then updated to 1092 and the minimum step (number of step-and-repeat operations) is updated from the minimum value of 3 to a value of seven at step 918 of FIG. 9. When the maximum delta is recomputed at step 920 ((185746−175830)/(7−1)=1653) in order to ignore displacements which would not yield a greater number of displacements (note that the denominator of the fraction is changed from the previous computation), it is seen that the number of displacements which can be ignored is substantially increased as indicated in FIG. 17 by the comparison of the values to be ignored (yielding early branching at 924) for minimum step =3 and minimum step=7; thus greatly reducing processing operations and time.

When the seven steppable shapes (beginning with 179194) are eliminated from the list of FIG. 16, only two shapes, shown in FIG. 18, remain, indicating (as determined at 814) that no significant further compaction is possible since this number of shapes is less than the minimum of three shapes. These two shapes are added to the major chain list, as before.

The major chain list now contains only the shapes shown in FIG. 19, having assigned doses of 25, 26 and 27. Any step-and-repeat operations found in this list will require invocation of the DOSEMERGE command and will be coded in the manner of FIGS. 3A and/or 6A. Since this coding scheme is not as compact as that of FIGS. 3B and/or 6B, significant compaction of data can only be achieved when four or more shapes are to be produced by step-and-repeat operations. Therefore, the maximum delta is computed as (186706−168150)/(4−1)=6185 (note the use of (4−1) in the denominator rather than (3−1), as in the initial computation for the minor chain lists, above). The computation of displacements yields a delta or displacement list as shown in FIG. 20.

When these displacements are analyzed by the process of FIGS. 8 and 9, invoked by detection of a different step criteria at 706, a chain is found yielding six shapes which may be reproduced by step-and-repeat operations with a displacement of 1120 and a starting shape address of 171350. A corresponding step-and-repeat command is generated at 816 and a dosemerge command is appended at 822 since the list being analyzed is a major list rather than a minor list. Removal of the corresponding shapes from the list of FIG. 19 yields the list of FIG. 21 which is then merged with the step-and-repeat operations encoded in the minor chains to yield the list shown in FIG. 22 which can be encoded in 45 bytes, as indicated therein. In contrast, the coding for all of the shapes of the list of FIG. 10 (but omitting the x or y, h and w parameters which are consistent for all shapes, by definition of the list) is shown in FIG. 23. Coding this information would require 70 bytes. Therefore, for this sample, the invention would provide a compaction of just less than 46%. Again, this degree of compaction is highly dependent on the nature of the data and often may not be as high as in this sample. However, since the amount of processing required by the present invention is small and rapidly accomplished, even when the degrees of compaction possible is small, it will be economically justified.

An example of the gains to be derived from the use of the present invention are shown in FIG. 24 for shape data as handled by eight shape pre-processors for various exemplary patterns. The byte count without compaction by the invention is shown in the first column labelled "No Stepping". The byte count after processing with the present invention is shown in the second column labelled "Stepping". The percentage reduction is shown in the third column labelled "Delta" and varies between 1.6% and 70.7 percent. For comparison, the method in accordance with the invention seldom exceeds 1% of the time required for processing a given volume of data in an exposure tool. Therefore, even with the wide variation in degrees of data compaction, all examples given in FIG. 24 would be considered to be economically justified. On average, a data volume reduction of about 20% is achieved through application of the invention.

The fourth column indicates the number of shapes which were found to fall within the stepping criteria and the percentage of the total number of shapes which could be stepped is indicated in the fifth column. The sixth column indicates the maximum number of steps in a chain and the seventh column gives the average number of steps in a chain. Most importantly, however, the execution speed of the present invention is shown in the eighth column, indicating that processing required only a few seconds in a significant number of cases even where the percentage reduction of data ranged as high as 25.5%. The largest percentage of data compaction required only 1 minute, 27 seconds. Therefore, it is clear that the invention provides significant advantages by detecting and avoiding analysis where no compaction is possible, converges rapidly to the highest possible stepping chain length and provides plural formats of compaction coding (appropriately choosing between them by virtue of the combination of computation of a maximum delta, imposition of a minimum step requirement and forming as many step-and-repeat chains as possible with a consistent dose as well as finding other chains which can be described with a dosemerge command.

Particularly in view of the dependence of the methodology of the present invention on the nature of the pattern data on which it operates, the omission of one or more of these features need not necessarily reduce the effectiveness of the invention for compressing pattern data in which certain statistical properties are known or can be found or extrapolated. For example, for very complex and highly ordered patterns, it could be assumed that the minimum stepping criteria would be met most of the time and the minimum stepping requirement could be omitted. Conversely, for highly random patterns, where the lists would be very short, the maximum delta computation could be omitted. Certain types of patterns will also favor either production of minor or major chains and processing speed gains may be achieved by omitting one or the other. While a reduction of compaction would then be expected, for example, if only a small percentage of shapes would ultimately fall within either major chains or minor chains, that type of chain can be omitted and the processing correspondingly reduced, often by a much larger percentage.

In view of the foregoing, it is seen that the invention provides a methodology for extracting data which represents repeated patterns or shapes and compacting data by encoding such repeated shapes as step-and-repeat commands. As such, the methodology provides a substantial enhancement for control of automated tools with numerical control data and allows compaction even of data where a parameter of the step-and-repeat operations is varied. The methodology also provides for extremely rapid and effective analysis of very large volumes of data.

While the invention has been described in terms of a single preferred embodiment and as applied to integrated circuit manufacture, those skilled in the art will recognize that the invention can be practiced with modification and with regard to other data environments within the spirit and scope of the appended claims. For example, either more or less parameters than x or y, h and w could be used for initial extraction of common features of data, such as a recognized character or image feature (as a single parameter) or a much larger set of characteristics such as might be encountered at a node of a hierarchical tree data structure. The "dose" parameter may be used as any variable parameter, such as type font, and could be expanded to two or more parameters in a hierarchical fashion. Further, delta may be scaled or modified in accordance with a non-linear or even a periodic or time varying function for purposes, for example, of decryption of variable codes. Therefore, the invention is seen to provide a powerful and flexible tool for extraction of repeating data from a large body of data and for coded data compaction.

Having thus described my invention, what I claim as new and desire to secure by Letters Patent is as follows:

1. Apparatus for compressing numerical control data comprising
    first comparison means for extracting at least one major list of data having identical values of at least one first parameter,
    second comparison means for extracting at least one minor list from said major list having identical values of a second parameter,
    means for determining displacements between members of said minor list,
    means for generating a step-and-repeat command descriptive of at least a minimum number of members of said minor list for which said displacements are identical, and
    means for removing members of said minor list which are described by said step-and-repeat command from said major list.

2. Apparatus as recited in claim 1, further including
    means for determining displacements between members of said major list subsequent to removal of members of said minor list which are described by said step-and-repeat command, and
    means for generating a step-and-repeat command descriptive of at least a minimum number of members of said major list for which said displacements are identical, said step-and-repeat command descriptive of at least a minimum number of members of said major list specifying a value of said second parameter for each of said at least minimum number of members of said minor list.

3. Apparatus for recited in claim 1, further including
    means for determining a range of addresses in said minor list, and
    means for computing a maximum displacement which is consistent with finding at least said minimum number of members separated by identical displacements within said range of addresses.

4. Apparatus as recited in claim 1, wherein said means for determining displacements in said minor list further includes
    storage means for accumulating a number of instances in which a displacement is determined to be identical to a displacement previously determined, and
    third comparison means for comparing said number of instances to said minimum number.

5. Apparatus as recited in claim 2, further including
    means for determining a range of addresses in at least one of said major list and said minor list, and
    means for computing a maximum displacement which is consistent with finding at least said minimum number of members separated by identical displacements within said range of addresses.

6. Apparatus as recited in claim 2, wherein said means for determining displacements in regard to at least one of said major and minor lists further includes
    storage means for accumulating a number of instances in which a displacement is determined to be identical to a displacement previously determined, and
    third comparison means for comparing said number of instances to said minimum number.

* * * * *